US008880782B2

(12) United States Patent
Ordentlich et al.

(10) Patent No.: US 8,880,782 B2
(45) Date of Patent: Nov. 4, 2014

(54) MEMORY ARRAY INCLUDING MULTI-STATE MEMORY DEVICES

(75) Inventors: Erik Ordentlich, San Jose, CA (US); Ron M. Roth, Haifa (IL); Gadiel Seroussi, Cupertino, CA (US)

(73) Assignee: Hewlett Packard Development Company, L. P., Houston, TX (US)

( * ) Notice: Subject to any disclaimer, the term of this patent is extended or adjusted under 35 U.S.C. 154(b) by 467 days.

(21) Appl. No.: 13/277,837

(22) Filed: Oct. 20, 2011

(65) Prior Publication Data

US 2013/0103888 A1 Apr. 25, 2013

(51) Int. Cl.
| G06F 12/00 | (2006.01) |
| G11C 13/00 | (2006.01) |
| G11C 11/56 | (2006.01) |
| G11C 7/10 | (2006.01) |
| G11C 16/00 | (2006.01) |

(52) U.S. Cl.
CPC ............ G11C 16/00 (2013.01); G11C 13/0069 (2013.01); G11C 11/5628 (2013.01); G11C 13/004 (2013.01); G11C 11/56 (2013.01); G11C 7/1006 (2013.01); G11C 11/5685 (2013.01); G11C 11/5642 (2013.01)

USPC .................. 711/103; 711/E12.069; 365/148; 365/221

(58) Field of Classification Search
USPC ........................................... 711/103; 365/148
See application file for complete search history.

(56) References Cited

U.S. PATENT DOCUMENTS

| 5,883,827 | A | * | 3/1999 | Morgan ........................ 365/100 |
| 7,440,316 | B1 | | 10/2008 | Lee et al. |
| 7,499,366 | B2 | | 3/2009 | Scheuerlein et al. |
| 7,982,504 | B1 | | 7/2011 | Robinett |
| 2007/0171725 | A1 | * | 7/2007 | Chan ........................ 365/185.22 |
| 2009/0310402 | A1 | | 12/2009 | Parkinson |
| 2011/0122675 | A1 | | 5/2011 | Parkinson |

* cited by examiner

Primary Examiner — Reginald Bragdon
Assistant Examiner — Hamdy S Ahmed (57) ABSTRACT

A data storage system including a memory array including a plurality of memory devices programmable in greater than two states. A memory control module may control operations of the memory array, and an encoder module may encode input data for storing to the memory array. The memory array may be an m×n memory array, and the memory control module may control operations of storing data to and retrieving data from the memory array.

18 Claims, 6 Drawing Sheets

MSB [0   0   0 ]

$A'_{2,3}$ ← $A_{2,3}$ $A'_{2,2}$     [ $A_{2,5}$   $A_{5,2}$   $A_{5,5}$ ]

[0   3   1 ]

MSB [0   1   0 ]

$A'_{2,2}$ ← Flip($A_{2,2}$)

MEMORY ARRAY INCLUDING MULTI-STATE MEMORY DEVICES

BACKGROUND

Memories may be based on resistive switching devices, such as, for example, memristors, which may be arranged in a crossbar architecture. A crossbar architecture may include, for example, a crossbar array including a plurality of memristors in each row and column. The number of memristors in any row or column that are in low resistance states can impact the performance of the memories. In order to program or read the value of a memristor, a respective write or read voltage may be applied to the memristor through the respective row and column wires of the selected memristor. However, other memristors connected to the same row and column wires of the selected memristor may also experience voltage drop across their terminals and may thus be considered half-selected. Such half-selected memristors that are in a low resistance state may also contribute to cumulative current draw. The cumulative current draw can lead, for example, to power wastage and inaccuracies in determination of the state of the selected memristor. The cumulative current draw can also lead, for example, to parasitic loss that can limit the crossbar array size.

BRIEF DESCRIPTION OF DRAWINGS

The embodiments are described with reference to the following figures.

DETAILED DESCRIPTION OF EMBODIMENTS

For simplicity and illustrative purposes, the principles of the embodiments are described by referring mainly to examples thereof. In the following description, numerous specific details are set forth in order to provide a thorough understanding of the embodiments. It will be apparent that the embodiments may be practiced without limitation to all the specific details. Also, the embodiments may be used together in various combinations.

1. Overview

For memories based on resistive switching devices, such as, for example, memristors, the number of such resistive switching devices placed in low resistance states may impact the memory performance. For example, a memory may include a crossbar array including a plurality of memristors in each row and column of the array. In order to program or read the value of a memristor, a respective write or read voltage may be applied to the memristor through the respective row and column wires of the selected memristor. However, other memristors connected to the same row and column wires of the selected memristor may also experience voltage drop across their terminals and may thus be considered half-selected. Such half-selected memristors that are in a low resistance state may also contribute to cumulative current draw. The memory performance for such crossbar arrays may be increased by limiting the number of memristors placed in a low resistance state.

A data storage system is provided and may include a memory array including a plurality of memory devices programmable in two or more states. For example, the memory devices may be programmable in greater than two resistance states. For example, the memory devices may be programmable in two resistance states (e.g., high and low resistance), or greater than two resistance states (i.e., multilevel resistance)). More generally, the memory devices may be programmable in greater than two states associated with a physical magnitude of a memory device. As described in detail below, a memory control module may control operations of the memory array. The modules and other components of the data storage system may include machine readable instructions, hardware or a combination of machine readable instructions and hardware.

For the data storage system described above, the memory array may be an m×n memory array, and the memory control module may control operations of storing data to and retrieving data from the memory array. As described in detail below, an encoder module may encode input data for storing to the memory array such that an amount of current leaking through half-selected memory devices in a selected row and a selected column of the m×n memory array is, respectively, less than or equal to nC/2 and mC/2, where C is a largest sum of half-select current magnitudes for pairs of complementary states. For example, as discussed in further detail below, h and s−1−h are defined as complementary state pairs, where s is a number of states of a memory device (i.e., resistance states for a memory device programmable in different resistance states), and h is a dummy variable. The encoder module may form a first sequence of symbols by grouping first (m−1)(n−1)k bits of the input data into (m−1)(n−1) groups of k bits, where k is an integer and the number of states (e.g., resistance states or states related to physical magnitude) may be represented as $2^k$. The encoder module may arrange the first sequence into an (m−1)×(n−1) array of k-bit symbols. The encoder module may form a second sequence of symbols by grouping remaining (m+n−1)(k−1) bits of the input data into groups of k−1 bits. The encoder module may extend the (m−1)×(n−1) array into the m×n memory array by filling in the m-th row and n-th column using the second sequence. The encoder module may locate a row or a column of the m×n memory array for which the amount of current leaking through the half-selected memory devices is, respectively, greater than nC/2 or mC/2, and for any such row or column, the encoder module may flip symbols of the row or column. For example, as described in detail below, symbols may be flipped by applying the mapping $f(h)=2^k-1-h$ to each symbol in the row, where k is an integer. In the general case, the "flip" mapping may be f(h)= s−1−h, where s is the number of resistance states for a resistive memory device. For example, based on the binary representation with k=2, values of 0 (i.e., binary 00) may be flipped to 3 (i.e., binary 11), values of 1 (i.e., binary 01) may be flipped to 2 (i.e., binary 10), values of 2 (i.e., binary 10) may be flipped to 1 (i.e., binary 01), and values of 3 (i.e., binary 11) may be flipped to 0 (i.e. binary 00). The encoder module may iteratively evaluate all rows and columns of the m×n memory array, and for any row or column for which the amount of current leaking through the half-selected memory devices is respectively greater than nC/2 or mC/2, the encoder module may flip symbols of the row or column.

As described in detail below, a decoder module may decode an encoded m×n memory array, wherein for i=1, 2, ..., m−1 and for j=1, 2, ..., n−1, the decoder module may set $A_{i,j}=2^k-1-A_{i,j}$ if $p(A_{m,j})+p(A_{m,n})+p(A_{m,n})=1$ modulo 2, where $A_{i,j}$ denotes entry (i,j) of the m×n memory array, function p(h) returns most significant bit in binary representation of h for case of $s=2^k$, s is a number of states, and k is an integer. For the decoder module, for j=1, 2, ..., n, if $p(A_{m,j})=1$, the decoder module may set $A_{m,j}=2^k-1-A_{m,j}$. For the decoder module, for i=1, 2, ..., m−1, if $p(A_{i,n})=1$, the decoder module may set $A_{i,n}=2^k-1-A_{i,n}$. The decoder module may arrange binary representations of entries in a subarray of a modified m×n memory array into a first binary sequence of length (m−1)(n−1)k. The decoder module may further arrange least significant k−1 bits of binary representations of entries in an m-th row and n-th column into a binary sequence of length (m+n−1)(k−1).

As also described in detail below, a method for accessing a memory array including a plurality of memory devices is provided and may include programming the memory devices in greater than two states (e.g., resistance states or states related to physical magnitude), and controlling operations of accessing the memory array. For the method, the memory array may be an m×n memory array, and the controlling may further include controlling operations of storing data to and retrieving data from the memory array. The method may further include encoding input data for storing to the m×n memory array such that an amount of current leaking through half-selected memory devices in a selected row and a selected column of the m×n memory array is, respectively, less than or equal to nC/2 and mC/2. Encoding input data may further include forming a first sequence of symbols by grouping first (m−1)(n−1)k bits of the input data into (m−1)(n−1) groups of k bits. Encoding input data may further include locating a row or a column of the m×n memory array for which the amount of current leaking through the half-selected memory devices is, respectively, greater than nC/2 or mC/2, and for any such row or column, flipping symbols of the row or column. Encoding input data may further include iteratively evaluating all rows and columns of the m×n memory array, and for any row or column for which the amount of current leaking through the half-selected memory devices is respectively greater than nC/2 or mC/2, flipping symbols of the row or column. The method may also include decoding an encoded m×n memory array, wherein for i=1, 2, ..., m−1 and for j=1, 2, ..., n−1, the decoding includes setting $A_{i,j}=2^k-1-A_{i,j}$ if $p(A_{i,n})+p(A_{m,j})+p(A_{m,n})=1$ modulo 2.

As also described in detail below, a non-transitory computer readable medium storing machine readable instructions is provided. The machine readable instructions when executed by a computer system may perform a method for accessing a memory array including a plurality of memory devices. The method may include programming the memory devices in greater than two states (e.g., resistance states or states related to physical magnitude), and controlling operations of accessing the memory array.

Based on the foregoing, the memory performance for such crossbar arrays including resistive memory devices programmed to be in one of a number of resistance states may be increased, for example, by limiting the number of memory devices placed in a low resistance state. Examples of increased memory performance may include a reduction in the cumulative current draw, which may provide for reduced power consumption and increased accuracy in determination of the state of a selected memory device. Reduction in the cumulative current draw may also lead, for example, to reduction in parasitic loss, which may thus provide for increase in a crossbar array size.

Although the discussion herein is related to resistive memory devices, the concepts may be applied to memory devices programmable in different resistance states or states related to physical magnitude of a memory device generally. For example, for any memory organized in rows and columns or by another method, where each memory cell can be in one of a set of states, each state may be associated with a physical magnitude. The concepts herein may be applied to limiting the sum of the magnitudes in each row and column. For example, in flash memory, states of memory cells may be associated with charge magnitudes, and the concepts described herein may be applied to limiting the sum of the charges of a row or column.

2. Structure and Method

Figure 1:
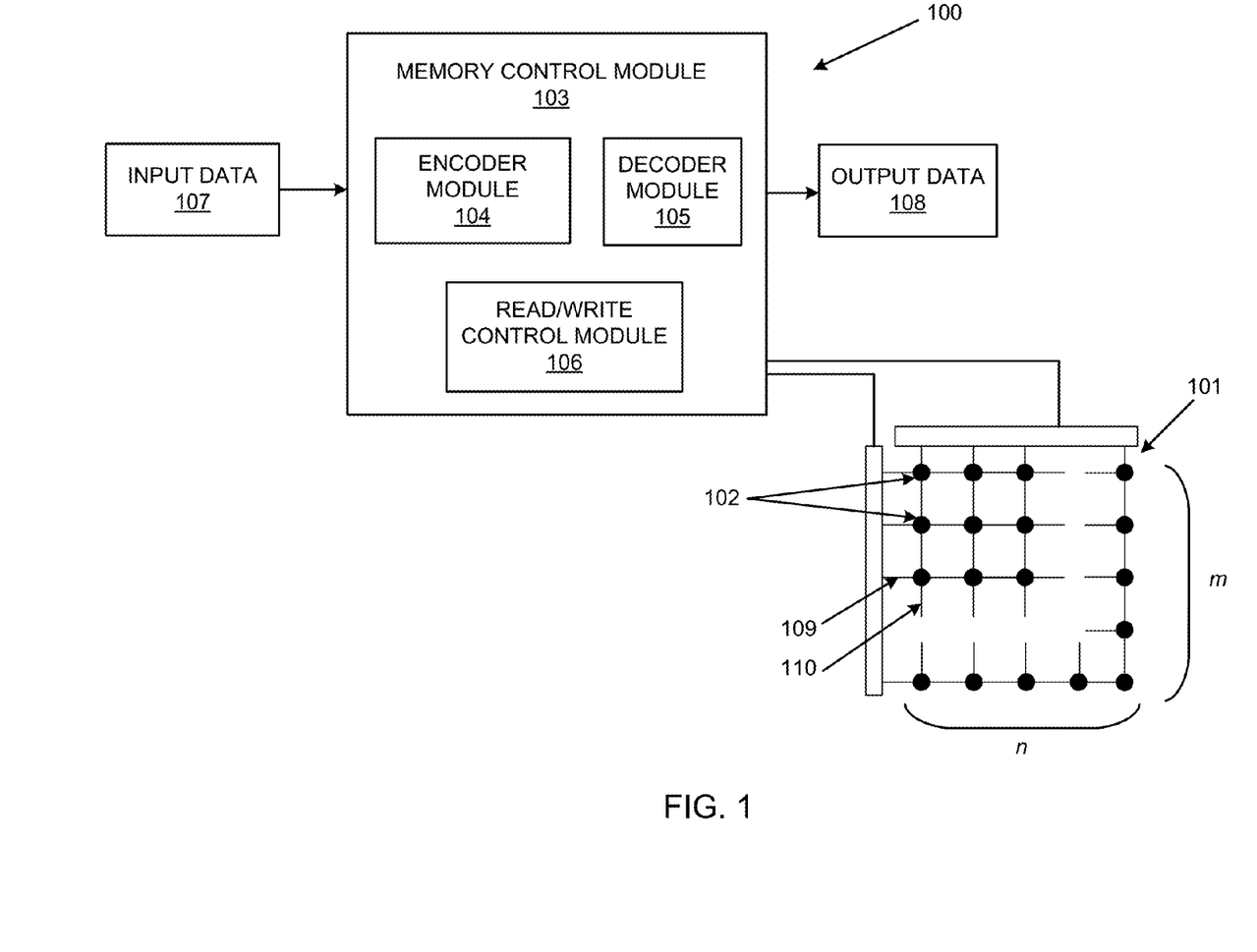
FIG. 1 illustrates a schematic view of a data storage system including a crossbar array of resistive switching devices, such as, for example, memristors, according to an embodiment.

FIG. 1 illustrates a schematic view of a data storage system 100 including an m×n memory array 101 of resistive memory devices 102, such as, for example, memristors, according to an embodiment. The system 100 may include a memory control module 103 to control operations of storing and retrieving data to and from the m×n memory array 101. An encoder module 104 may provide for data encoding, and a decoder module 105 may provide for data decoding. A read/write control module 106 may control operations of reading data from the memory array 101 and writing data to the memory array. The memory control module 103 may encode input data 107, and store the encoded data into the memory array 101. The memory control module 103 may also read out the encoded data stored in the memory array 101, decode the data to recover the original bits in the input data 107, and transmit the decoded data as output data 108.

Referring to FIG. 1, the m×n memory array 101 may respectively include first and second sets of m and n conductors. Each of the m conductors in the first set may intersect with each of the n conductors in the second set to address one of the memory devices 102 located at the intersection. In order to facilitate a description of the memory array 101, the conductors in the first and second sets may be respectively referred to as row and column conductors. The m×n memory array 101 may include m row wire segments 109 and n column wire segments 110 in a circuit plane. The intersections of the row and column wire segments may form a total of m×n memory devices. The conductors and memory devices may be formed in different circuit planes. Moreover, the conductors may be formed of a variety of shapes as needed, and may likewise form a grid of a variety of shapes.

The resistive memory devices 102 (e.g., memristors) may be programmed to be in one of a number s resistance states such that at the maximum half-select voltage, the current magnitudes passing through the memory devices in each of these respective states may be denoted $c_0 < c_1 < \ldots < c_{s-1}$ with $c_h + c_{s-1-h} \le C_0 + C_{s-1} = C$ for each h. C may be defined as a largest sum of half-select current magnitudes for pairs of complementary states. For example, h and s−1−h are defined as a pair of complementary states or as a complementary state pair, where s is a number of resistance states of a memory device, and h is a dummy variable. Thus C may be defined as the maximum of $C_h + c_{s-1-h}$ over h, that is, the maximum sum of half select-current magnitudes between states that can be flipped to each other. C will in general be greater than the maximum half-select current magnitude, which is $c_{s-1}$. The maximum of $c_h + c_{s-1-h}$ may be attained, for example, at h=0, or may also be otherwise specified. The aggregate state of the resistive memory devices 102 may be represented in a m×n crossbar, for example, as the m×n memory array 101 over the alphabet {0, 1, ..., s−1}. An array entry having the value h may indicate that the resistive memory device 102 at the corresponding location in the crossbar is in a state leading to half-select current $c_h$. The half-select current may be denoted using the functional notation $c(h)=c_h$. Array entries may be referred to using their row and column indices. For example, the entry in row i and column j may be referred to using the ordered pair (i, j). Given an array A, the notation $A_{i,j}$ may denote entry (i, j) of the array.

For a number x let $\lfloor x \rfloor$ denote the greatest integer less than or equal to x. Given m and n, length $\lfloor (m-1)(n-1)\log_2 s+(m+n-1)\log_2 \lfloor s/2 \rfloor \rfloor$ strings of unconstrained bits of the input data 107 may be encoded and decoded to and from the m×n arrays 101 over the alphabet {0, 1, ..., s−1} which satisfy the following constraints, respectively, for each i, and for each j:

$$\frac{1}{n}\sum_{j=1}^{n} c(A_{i,j}) \leq \frac{C}{2} \quad (1)$$

$$\frac{1}{m}\sum_{i=1}^{m} c(A_{i,j}) \leq \frac{C}{2} \quad (2)$$

If s=2 (i.e., the binary case), these constraints reduce to the constraint discussed in detail in co-pending PCT Patent Application Serial No. PCT/US2010/040321, filed Jun. 29, 2010. For example, for s=2, each row and column of the encoded array may respectively contain no more than n/2 and m/2 1's. For s resistance states generally, if the writing procedure involves putting 0 volts on the conductors of unselected resistive memory devices 102 and the full-select voltage across the conductors of the selected memory devices, these constraints may ensure that the amount of current leaking through the half-selected memory devices in the selected row and column is, respectively, at most nC/2 and mC/2 as opposed to, for example, $(n-1)c_{s-1}$ and $(m-1)c_{s-1}$ without the constraint. Among the assumed states of the resistive memory devices 102, $c_{s-1}$ may be the maximum half-select current and $C/2=(c_0+c_{s-1})/2$ may be approximately $c_{s-1}/2$ assuming a very small value of $c_0$. Thus the maximum leakage current may be reduced in approximately half.

Figure 2:
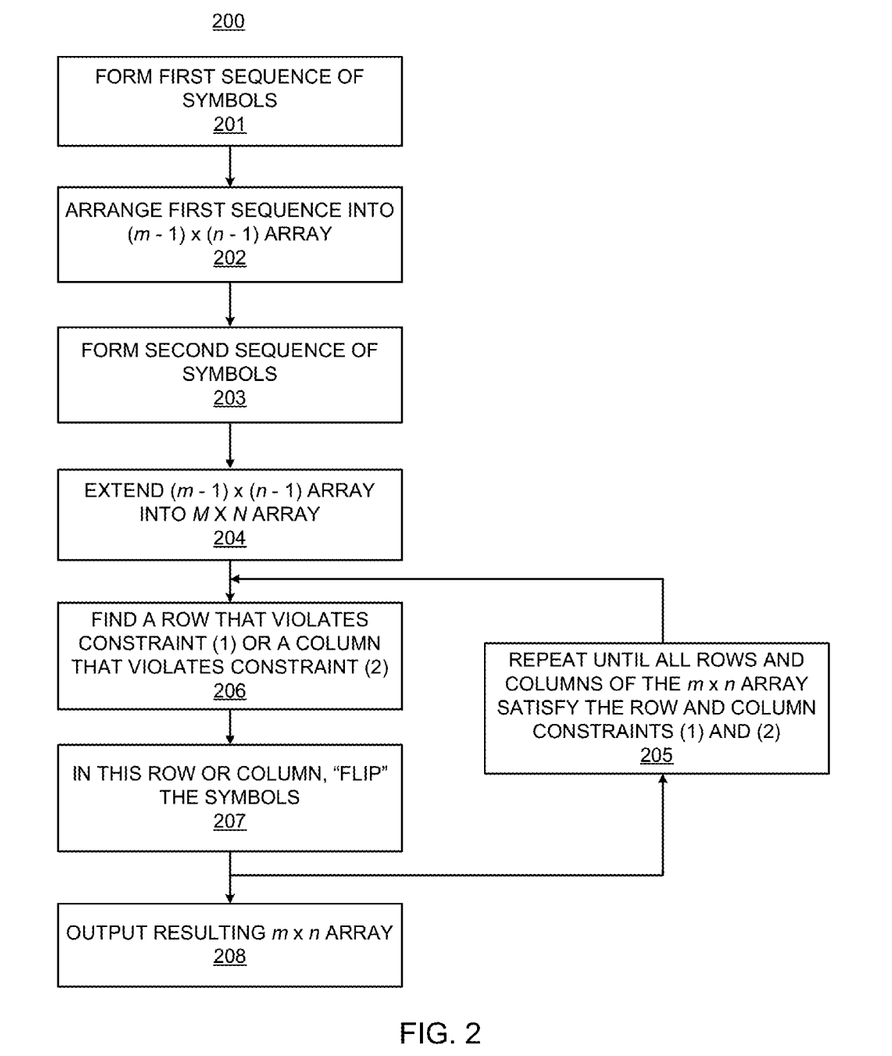
FIG. 2 illustrates a method of encoding, according to an embodiment.

FIG. 2 illustrates a method of encoding 200 using the encoder module 104 of FIG. 1, according to an embodiment. The method of encoding is described in conjunction with the operation of the data storage system 100.

Referring to FIG. 1, the number of bits of the input data 107 to be encoded may be denoted R as follows:

$$R=\lfloor (m-1)(n-1)\log_3 s+(m+n-1)\log_2 \lfloor s/2 \rfloor \rfloor \quad (3)$$

Thus R bits may be encoded and decoded to and from a sequence of (m−1)(n−1) symbols over the alphabet {0, 1, ..., s−1} followed by another sequence of m+n−1 symbols over the alphabet {0, 1, ..., $\lfloor s/2 \rfloor$−1}. For s=2 and s=3, the latter alphabet equates to {0}, and, therefore, having one symbol, the additional sequence carries no additional information and includes all 0's.

For $s=2^k$ for an integer k, the binary input bits may be encoded into the above sequences by partitioning the input bits into (m−1)(n−1) groups of k bits followed by (m+n−1) groups of k−1 bits, with the groups mapping onto the above alphabets using a binary representation.

For the number of resistance states (i.e., $s=2^k$) and the number of input bits to be encoded (i.e., R as denoted above), the encoder module 104 may perform the following operations. For an input of arbitrary string of R bits denoted as u (i.e., the input data 107), the encoder module 104 may output an m×n array satisfying the constraints (1) and (2) specified above. Referring to FIGS. 1 and 2, in order to encode the input data 107, the encoder module 104 may proceed as follows.

At block 201, the encoder module 104 may form a first sequence of symbols over the alphabet {0, 1, ..., $2^k$−1} by grouping first (m−1)(n−1)k bits of u into (m−1)(n−1) groups of k bits with each such group, via a binary (or base 2) representation of integers, corresponding to a symbol in {0, 1, ..., $2^k$−1}.

At block 202, the encoder module 104 may arrange the first sequence into an (m−1)×(n−1) array (e.g., first n−1 of symbols into first row, next n−1 symbols into second row, etc.).

At block 203, a second sequence of symbols may be formed over the alphabet {0, 1, ..., $2^{k-1}$−1} grouping the remaining (m+n−1)(k−1) input bits left over from block 201 into groups of k−1 bits with each group, again via a binary representation, corresponding to a symbol in {0, 1, ..., $2^{k-1}$1}.

At block 204, the encoder module 104 may extend the (m−1)×(n−1) array (formed at block 202) into an m×n array by filling in the m-th row and n-th column (total of m+n−1 elements) using the second sequence formed at block 203.

At block 205, the following encoding procedures at blocks 206 and 207 may be repeated until all rows and columns of the m×n array, respectively, satisfy the row and column constraints (1) and (2) specified above.

At block 206, the encoder module 104 may find a row that violates constraint (1) or a column that violates constraint (2). If no such row or column exists, the encoder module 104 may proceed to block 208.

At block 207, in this row or column, the encoder module 104 may "flip" the symbols by applying the mapping $f(h)=2^k-1-h$ to each symbol in the row or column. In the general case, the "flip" mapping may be $f(h)=s-1-h$.

At block 208, based on the foregoing, the encoder module 104 may output the resulting m×n array as A. It is noted that the sequence of procedures specified above are provided as an example of the operation of the encoder module 104, and may be modified as needed.

The foregoing procedure of encoding the input data 107 is well defined in that the processing at blocks 205-207 will terminate. Since the selected row or column in each iteration of the processing at block 206 violates the corresponding constraint (1) or (2), if C' is the initial average of $c(A_{i,j})$ over the row or column, the average after the flipping process may be no more than C−C', and if C'>C/2 then C−C'<C' which means that the sum of $c(A_{i,j})$ over the entire array has decreased. Thus the foregoing procedure reaches a point where no row or column violating the constraint is found and the resulting array satisfies the desired constraints.

For the iteration at blocks 205-207, many possible variations exist, such as, for example, a greedy procedure to flip the row or column which violates the constraint by the greatest margin. Alternatively, all constraint violating rows can be dealt with, followed by all constraint violating columns, and then rows, and so on.

In contrast to the binary case, for $s=2^k$ with k≥2, the foregoing encoding procedure also stores information in the last row and column of the array. These entries store one fewer bit each than the entries in the upper-left (m−1)×(n−1) subarray. The most significant bits of these entries may be initialized to 0 and record the effect of the flipping process on the array entries so that it can be inverted during decoding. Generally, any bit position of the symbol values in the boundary positions may be used (e.g., least significant, second most significant, etc). Moreover, other positions in the array besides the last row and column may also be used for this purpose.

Figure 3:
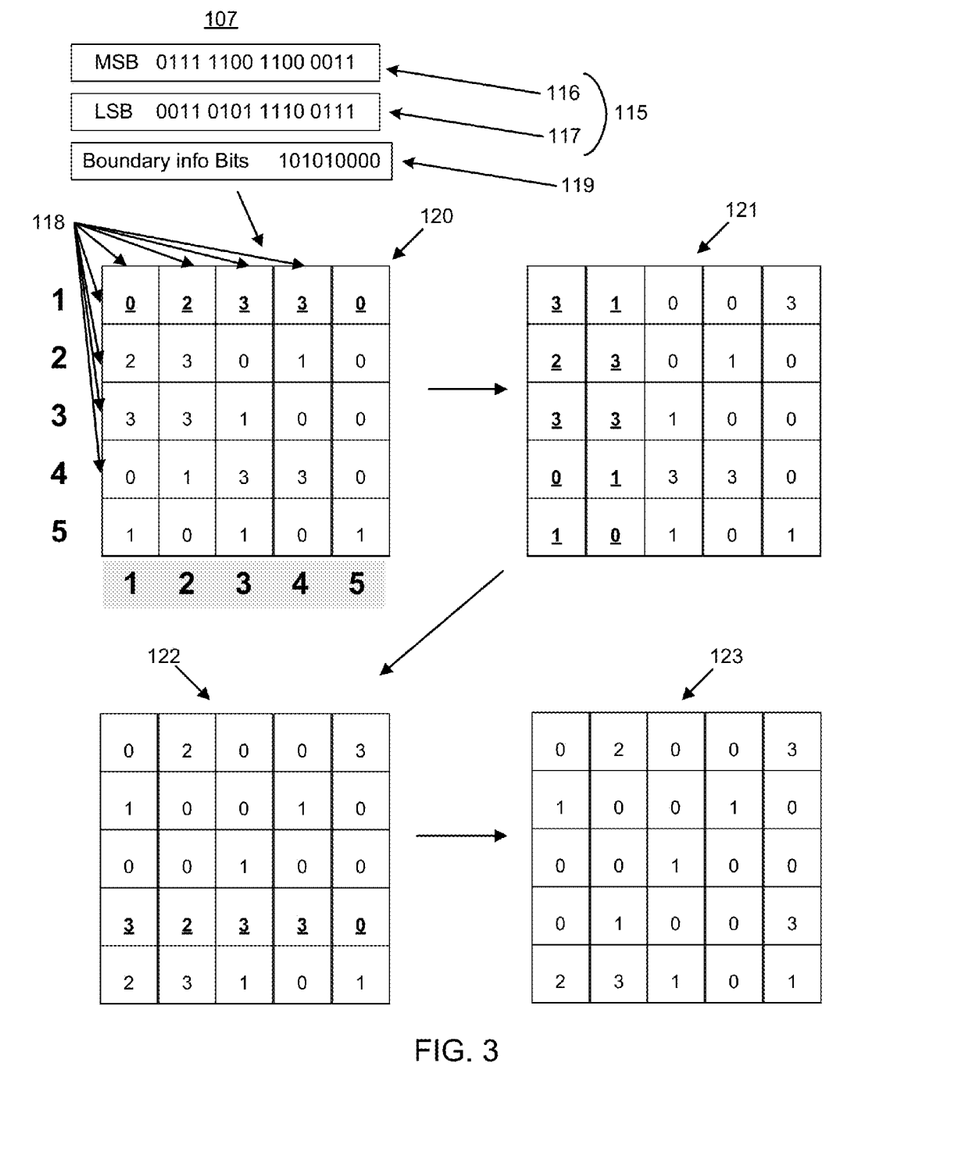
FIG. 3 illustrates an example of the processing of bits for a memristor during an encoding process, according to an embodiment.

Referring to FIG. 3, an example of the processing of the input data 107 by the encoder module 104 for four resistance states (i.e., s=4, k=2, and m=n=5) is described.

Referring to block 201 above (see FIG. 2), the input data 107 may be formed into a first sequence 115 of symbols including the most significant bit (MSB) values 116, and the least significant bit (LSB) values 117. The first sequence of symbols over the alphabet $\{0, 1, \ldots, 2^k-1\}$ may be formed by grouping first (m−1)(n−1)k bits of the input sequence u into (m−1)(n−1) groups of k bits with each such group, via the binary (or base 2) representation of integers, corresponding to a symbol in $\{0, 1, \ldots, 2^k-1\}$. Referring to block 202 above, the first sequence 115 may be arranged into an (m−1)×(n−1) array 118 (e.g., first n−1 of symbols into first row, next n−1 symbols into second row, etc.). For example, for array 118, the first n−1 symbols may include 0 2 3 3, the second n−1 symbols may include 2 3 0 1 etc. The value $A_{1,1}$ may be obtained based on the first values of the MSB=0 and LSB=0, thus the binary representation 00 equates to $A_{1,1}$=0. The value $A_{1,2}$ may be obtained based on the first values of the MSB=1 and LSB=0, thus the binary representation 10 equates to $A_{1,2}$=2. The remaining values of the array 118 may be similarly obtained. Referring to block 203 above, a second sequence 119 of symbols may be formed. The second sequence of symbols may be formed over the alphabet $\{0, 1, \ldots, 2^{k-1}-1\}$ grouping the remaining (m+n−1)(k−1) input bits left over from block 201 into groups of k−1 bits with each group, again via a binary representation, corresponding to a symbol in $\{0, 1, \ldots, 2^{k-1}-1\}$. The second sequence 119 may thus include the boundary info bits 101010000. Referring to block 204 above, the (m−1)×(n−1) array 118 may be extended into an m×n array 120 by filling in the m-th row and n-th column (total of m+n−1 elements) using the second sequence formed at block 203.

Referring to block 205 above, the processing at blocks 206 and 207 may be repeated until all rows and columns of the m×n array, respectively, satisfy the row and column constraints (1) and (2) specified above. For example, for block 206, the encoder 104 may find a row that violates constraint (1) or a column that violates constraint (2). If no such row or column exists, the encoder module 104 may proceed to block 208. For the m×n array 120, for s=4, constraints (1) and (2) may be specified such that C=3. In this regard, the implicit assumption is made that $c(A_{i,j})=A_{i,j}$. For example, for s=4, the right side of the inequality for constraint (1) may be 3/2. For constraints (1) and (2), with m=n=5 for the example of FIG. 3, the sum of the entries in every row and column may at most be 3/2×n (or m)=7.5. Rounding 7.5 to the lowest integer, the sum of the entries in every row and column may at most be 7.0. For the m×n array 120, row 1 violates this constraint in that the sum of the entries is 8. Thus for row 1, at block 207, the symbols may be flipped by applying the mapping $f(h)=2^k-1-h$ to each symbol in the row. In the general case, the "flip" mapping may be $f(h)=s-1-h$. For example, based on the binary representation, values of 0 may be flipped to 3, values of 1 may be flipped to 2, values of 2 may be flipped to 1, and values of 3 may be flipped to 0. Based on the foregoing, row 1 of the array 120 may be flipped as shown at array 121. For array 121, columns 1 and 2 violate the constraint in that the sum of the entries is 9 and 8, respectively. For columns 1 and 2, the symbols may be flipped by applying the mapping $f(h)=2^k-1-h$ to each symbol in the column. Based on the foregoing, columns 1 and 2 of the array 121 may be flipped as shown at array 122. For the array 122, row 4 violates this constraint in that the sum of the entries is 11. Row 4 of the array 122 may be flipped as shown at array 123, which satisfies both the constraints (1) and (2).

Figure 4:
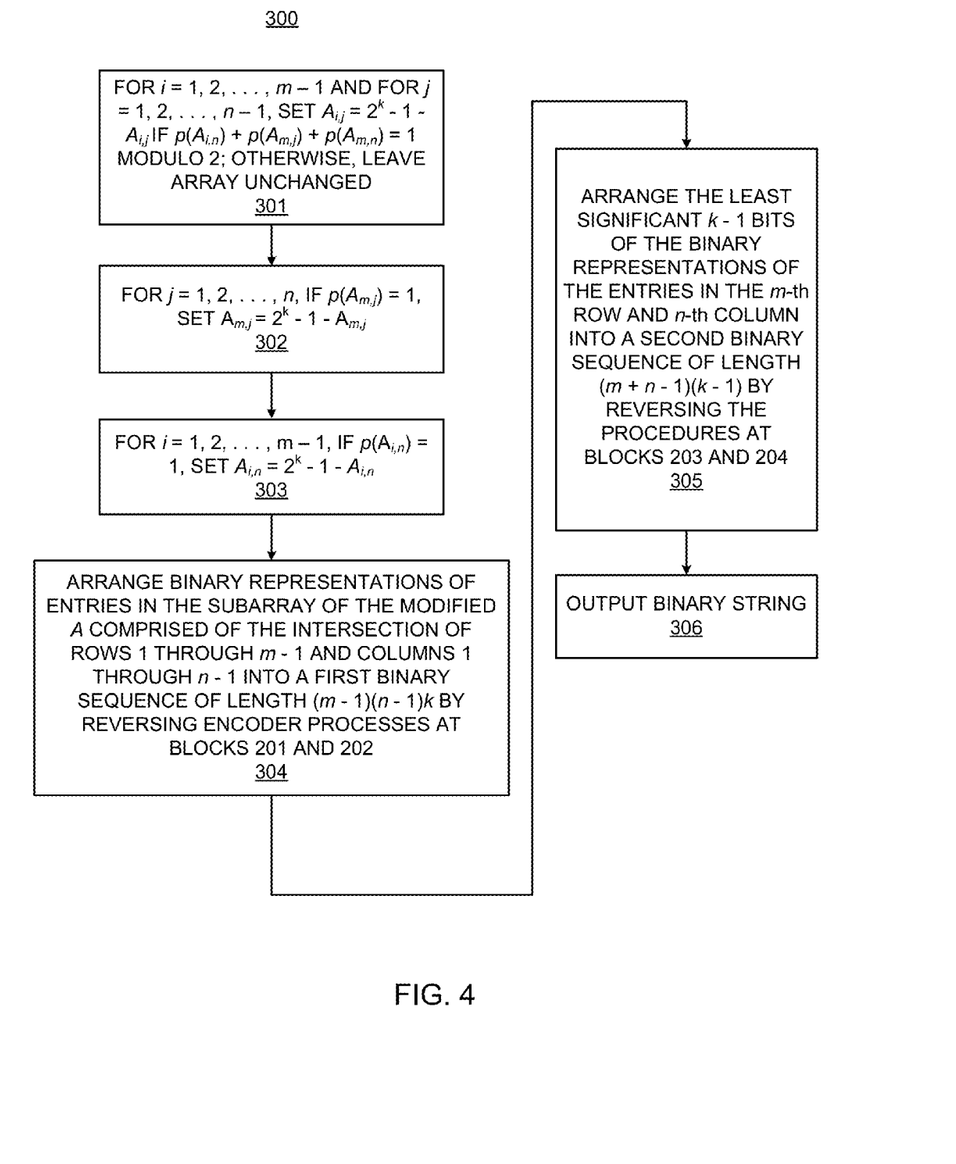
FIG. 4 illustrates a method of decoding, according to an embodiment.

Next, decoding using the decoder module 105 is described with reference to FIG. 1. FIG. 4 illustrates a method of decoding 300 using the decoder module 105, according to an embodiment. The method of decoding is described in conjunction with the operation of the data storage system 100.

Given an array, such as, for example, array 123 created using the encoding procedure described above, the decoder module 105 may return the R bits that were the input to the encoder module 104. For the decoder module 105, the function p(h) may return the most significant bit in the binary representation of h for the case of $s=2^k$ and may be represented as follows:

$$p(h) = \begin{cases} 1 & \text{if } h > (s-1)/2 \\ 0 & \text{otherwise} \end{cases} \qquad (4)$$

For $h\{0, 1, \ldots, 2^k-1\}$, the function p(h) may thus evaluate to 1 if $h\{2^{k-1}, 2^{k-1}+1, \ldots, 2^k-1\}$, and to 0 otherwise.

For an input of an m×n array A, the decoder module 105 may output an arbitrary string of R bits u. Referring to FIGS. 1 and 4, in order to decode the m×n array A, the decoder module 105 may proceed as follows:

At block 301, for i=1, 2, ..., m−1 and for j=1, 2, ..., n−1, the decoder module 105 may set $A_{i,j}=2^k-1-A_{i,j}$ (i.e., flip $A_{i,j}$) if $p(A_{i,n})+p(A_{m,j})+p(A_{m,n})=1$ modulo 2 (i.e., the sum of the p(·) is odd). Otherwise, the decoder module 105 may leave the array values unchanged.

At block 302, for j=1, 2, ..., n, if $p(A_{m,j})=1$, the decoder module 105 may set $A_{m,j}=2^k-1-A_{m,j}$.

At block 303, for i=1, 2, ..., m−1, if $p(A_{i,n})=1$, the decoder module 105 may set $A_{i,n}=2^k-1-A_{i,n}$. It should be noted that for blocks 302 and 303, if for block 301 i and j are set such that i=1, 2, ..., m and j=1, 2, ..., n, the right values may be determinable for $A_{\{m,j\}}$ and $A_{\{i,n\}}$, and thus blocks 302 and 303 may be bypassed.

At block 304, the decoder module 105 may arrange the binary representations of the entries in the subarray of the modified A comprised of the intersection of rows 1 through m−1 and columns 1 through n−1 into a first binary sequence of length (m−1)(n−1)k by reversing encoder processes at blocks 201 and 202 (see FIG. 2).

At block 305, the decoder module 105 may arrange the least significant k−1 bits of the binary representations of the entries in the m-th row and n-th column into a second binary sequence of length (m+n−1)(k−1) by reversing the procedures at blocks 203 and 204 of the encoding process. The first and second binary strings may be concatenated to form string u.

At block 306, the decoder module 105 may output binary string u (i.e., output data 108).

Verification of the decoding process is described next.

In order to verify that the decoding of an encoded array via the above procedures does indeed recover the original string, it suffices to check that for each (i, j), the array entry at position (i, j) is "flipped" an odd number of times (resulting in a net flip) per blocks 205-207 of the encoding method 200 if it is flipped for blocks 301-303 of the decoding method 300. As discussed above, a "flip" refers to an application of the mapping f(h) specified at block 207 of the encoding method 200. For the border entries processed in blocks 302 and 303, these values may be initialized so that $p(A_{i,j})=0$ and each flip during encoding toggles the value of $p(A_{i,j})$. Thus, the final value of $p(A_{i,j})$ is 1 if there were an odd number of flips. For the entries with i=1, 2, ..., m−1 and j=1, 2, ..., n−1 processed at block 301, let $p_{i,j}$, $p_{i,n}$, $p_{m,j}$, and $p_{m,n}$ respectively denote the number of times modulo 2 (i.e., 0 if even, 1 if odd) that entries (i, j), (i, n), (m, j) and (m, n) are flipped during encoding. Note that since the latter three entries are initialized so that the function $p(\cdot)$ above applied to these entries is 0 (at block 204 of the encoding process) and since a flip also flips the value of this function, $p_{i,n}$, $p_{m,j}$, $p_{m,n}$ coincide respectively with $p(A_{i,n})$, $p(A_{m,j})$, $p(A_{m,n})$ where $A_{i,n}$, $A_{m,j}$, $A_{m,n}$ are the final encoded values of these entries.

Regardless of the sequence of flips that may have occurred during encoding, $p_{i,j}+p_{i,n}+p_{m,j}+p_{m,n}=0$ modulo 2 (i.e., the sum is even). For example, if any one of the corresponding array entries is flipped during a given application of the process at block 207 of the encoding method 200, one of the three other entries is also flipped in that process (this would be the entry in the same row as the flipped entry if the flip was the result of a row-flip, or the same column if the flip was the result of a column-flip). Thus, the total number of flips among the four entries increases by 2 for each encoder row or column flip, and since the initial number of flips is 0, the total number of flips will be even and hence $p_{i,j}+p_{i,n}+p_{m,j}+p_{m,n}=0$ modulo 2 will hold. Rewriting this equation, $p_{i,j}=p_{i,n}+p_{m,j}+p_{m,n}$ modulo 2, implying that entry (i, j) is flipped an odd number times if $p_{i,n}+p_{m,j}+p_{m,n}=p(A_{i,n})+(A_{m,j})+p(A_{m,n})=1$ modulo 2, which is the condition for flipping bit (i, j) at block 301 of the decoding method 300.

Figure 5:
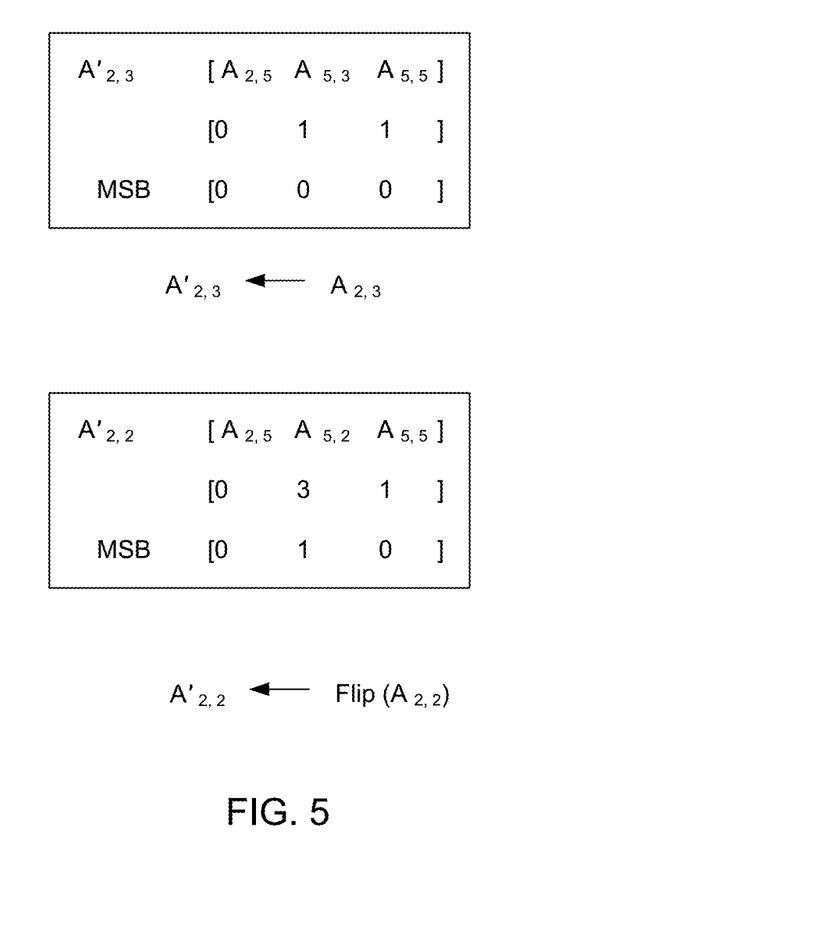
FIG. 5 illustrates an example of the processing of bits for a memristor during a decoding process, according to an embodiment.

Referring to FIG. 5, an example of the processing of an m×n array, such as, for example, the array 123 of FIG. 3 by the decoder module 105 into a length-R string of bits (i.e., output data 108) is described. Referring to FIGS. 1 and 5, in order to decode the m×n array 123, the decoder module 105 may proceed as follows.

Referring to FIGS. 1 and 3-5, at block 301 of FIG. 4, for $i=1, 2, \ldots, m-1$ and for $j=1, 2, \ldots, n-1$, the decoder module 105 may set $a_{i,j}=2^k-1-A_{i,j}$ if $p(A_{i,n})+p(A_{m,j})+p(A_{m,n})=1$ modulo 2 (i.e., the sum of the $p(\cdot)$ is odd). Otherwise, the decoder module 105 may leave the array values unchanged. At block 302, for $j=1, 2, \ldots, n$, if $p(A_{m,j})=1$, the decoder module 105 may set $A_{m,j}=2^k-1-A_{m,j}$. At block 303, for $i=1, 2, \ldots, m-1$, if $p(A_{i,n})=1$, the decoder module 105 may set $A_{i,n}=2^k-1-A_{i,n}$. For example, for array 123 of FIG. 3, it can be seen that the symbol $A_{2,3}$ is not flipped from the initial value of 0 (see array 120) to the same value of 0 (see array 123). Referring to FIG. 5, assuming for purposes of this example $A'_{2,3}$ is the to-be-determined decoded symbol for the encoded array 123, looking at symbols $A_{2,5}$, $A_{5,3}$, and $A_{5,5}$ of the encoded array 123, the values of which are respectively 0, 1 and 1, since the MSBs for these values are 0, 0 and 0, which add up to 0 modulo 2, this results in $A'_{2,3}=A_{2,3}$ (i.e., the decoded symbol for the array 123 is the same as the corresponding encoded symbol for the array 123). In another example, for array 123 of FIG. 3, it can be seen that the symbol $A_{2,2}$ is flipped from the initial value of 3 (see array 120) to a value of 0 (see array 123). Referring to FIG. 5, assuming $A'_{2,2}$ is the to-be-determined decoded symbol for the encoded array 123, looking at bits $A_{2,5}$, $A_{5,2}$, and $A_{5,5}$, the values of which are respectively 0, 3 and 1, since the MSBs for these values are 0, 1 and 0, which add up to 1 modulo 2, $A_{2,2}$ for the array 123 may be flipped to obtain $A'_{2,2}$ (i.e., the decoded symbol for the array 123 is obtained by flipping the corresponding encoded symbol for the array 123). In this manner, all bits of array 123 may be evaluated to determine the original values of the input data 107. Once the original values of array 123 are obtained, at block 304, the decoder module 105 may arrange the binary representations of the entries in the subarray of the modified A comprised of the intersection of rows 1 through m−1 and columns 1 through n−1 into a first binary sequence of length (m−1)(n−1)k by reversing encoder processes at blocks 201 and 202 (see FIG. 2). At block 305, the decoder module 105 may arrange the least significant k−1 bits of the binary representations of the entries in the m-th row and n-th column into a second binary sequence of length (m+n−1)(k−1) by reversing the procedures at blocks 203 and 204 of the encoding method 200. The first and second binary strings may be concatenated to form string u. At block 306, the decoder module 105 may output binary string u (i.e., output data 108 which matches the input data 107).

3. Computer Readable Medium

Figure 6:
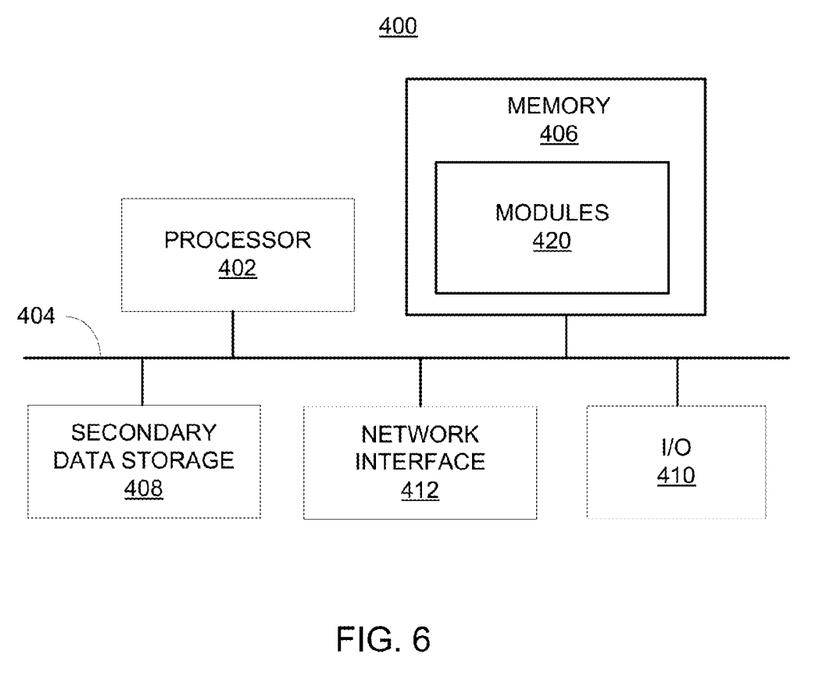
FIG. 6 illustrates a computer system, according to an embodiment.

FIG. 6 shows a computer system 400 that may be used with the embodiments described herein. The computer system 400 represents a generic platform that includes components that may be in a server or another computer system. The computer system 400 may be used as a platform for the system 100. The computer system 400 may execute, by a processor or other hardware processing circuit, the methods, functions and other processes described herein. These methods, functions and other processes may be embodied as machine readable instructions stored on computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 400 includes a processor 402 that may implement or execute machine readable instructions performing some or all of the methods, functions and other processes described herein. Commands and data from the processor 402 are communicated over a communication bus 404. The computer system 400 also includes a main memory 406, such as a random access memory (RAM), where the machine readable instructions and data for the processor 402 may reside during runtime, and a secondary data storage 408, which may be non-volatile and stores machine readable instructions and data. The secondary data storage 408 may be the same as or similar to the system 100. The memory and data storage are examples of computer readable mediums. The memory 406 may include modules 420 including machine readable instructions residing in the memory 406 during runtime and executed by the processor 402. The modules 420 may include the modules 103-106 of the system 100 shown in FIG. 1.

The computer system 400 may include an I/O device 410, such as a keyboard, a mouse, a display, etc. The computer system 400 may include a network interface 412 for connecting to a network. Other known electronic components may be added or substituted in the computer system 400.

While the embodiments have been described with reference to examples, various modifications to the described embodiments may be made without departing from the scope of the claimed embodiments.

What is claimed is:

1. A data storage system comprising:
   a memory array including a plurality of memory devices programmable in greater than two states, wherein the memory array is an m×n memory array;
   a memory control module, executed by a processor, to control operations of storing data to and retrieving data from the m×n memory array; and
   an encoder module to encode input data for storing to the m×n memory array such that an amount of current leaking through half-selected memory devices in a selected row and a selected column of the m×n memory array is, respectively, less than or equal to nC/2 and mC/2, where C is a largest sum of half-select current magnitudes for pairs of complementary states.

2. The data storage system of claim 1, wherein the memory devices are programmable in greater than two resistance states.

3. The data storage system of claim 1, wherein the memory devices are programmable in greater than two states associated with a physical magnitude of a memory device.

4. The data storage system of claim 1, wherein the encoder module is to encode the input data for storing to the m×n memory array by forming a first sequence of symbols by grouping first (m−1)(n−1)k bits of the input data into (m−1)(n−1) groups of k bits, where k is an integer.

5. The data storage system of claim 4, wherein the encoder module is to arrange the first sequence into an (m−1)×(n−1) array.

6. The data storage system of claim 5, wherein the encoder module is to form a second sequence of symbols by grouping remaining (m+n−1)(k−1) bits of the input data into groups of k−1 bits.

7. The data storage system of claim 6, wherein the encoder module is to extend the (m−1)×(n−1) array into the m×n memory array by filling in the m-th row and n-th column using the second sequence.

8. The data storage system of claim 1, wherein the encoder module is to locate a row or a column of the m×n memory array for which the amount of current leaking through half-selected memory devices is, respectively, greater than nC/2 or mC/2, and for any such row or column, the encoder module is to flip symbols of the row or column.

9. The data storage system of claim 1, wherein the encoder module is to iteratively evaluate all rows and columns of the m×n memory array, and for any row or column for which the amount of current leaking through half-selected memory devices is respectively greater than nC/2 or mC/2, the encoder module is to flip symbols of the row or column.

10. The data storage system of claim 1, wherein the m×n memory array is encoded, further comprising a decoder module to decode the encoded m×n memory array, wherein for i=1, 2, . . . , m and for j=1, 2, . . . , n, the decoder module is to set $A_{i,j}=2^k-1-A_{i,j}$ if $p(A_{i,n})+p(A_{m,j})+p(A_{m,n})=1$ modulo 2, where $A_{i,j}$ denotes entry (i, j) of the m×n memory array, function p(h) returns most significant bit in binary representation of h for case of $s=2^k$, s is a number of states, and k is an integer.

11. The data storage system of claim 1, wherein the m×n memory array is encoded, further comprising a decoder module to decode the encoded m×n memory array, wherein the decoder module is to arrange binary representations of entries in a subarray of a modified m×n memory array into a first binary sequence of length (m−1)(n−1)k, where k is an integer.

12. The data storage system of claim 1, wherein the m×n memory array is encoded, further comprising a decoder module to decode the encoded m×n memory array, wherein the decoder module is to arrange least significant k−1 bits of binary representations of entries in an m-th row and n-th column into a binary sequence of length (m+n−1)(k−1), where k is an integer.

13. A method for accessing an m×n memory array including a plurality of memory devices, the method comprising:
programming the memory devices in greater than two states;
controlling, by a processor, operations of accessing the m×n memory array;
encoding input data for storing to the m×n memory array to generate an encoded m×n memory array; and
decoding the encoded m×n memory array, wherein for i=1, 2, . . . , m and for j=1, 2, . . . , n, setting $A_{i,j}=2^k-1-A_{i,j}$ if $p(A_{i,n})+p(A_{m,j})+p(A_{m,n})=1$ modulo 2 where $A_{i,j}$ denotes entry (i, j) of the encoded m×n memory array, function p(h) returns most significant bit in binary representation of h for case of $s=2^k$, s is a number of states, and k is an integer.

14. The method of claim 13, wherein the memory devices are programmable in greater than two resistance states.

15. The method of claim 13, wherein the memory devices are programmable in greater than two states associated with a physical magnitude of a memory device.

16. The method of claim 13, wherein the controlling further comprising controlling operations of storing data to and retrieving data from the m×n memory array.

17. The method of claim 16, wherein encoding the input data further comprising encoding the input data such that an amount of current leaking through half-selected memory devices in a selected row and a selected column of the m×n memory array is, respectively, less than or equal to nC/2 and mC/2, where C is a largest sum of half-select current magnitudes for pairs of complementary states.

18. A non-transitory computer readable medium storing machine readable instructions, that when executed by a computer system, perform a method for accessing an m×n memory array including a plurality of memory devices, the method comprising:
programming the memory devices in greater than two states;
controlling, by a processor, operations of accessing the m×n memory array;
encoding input data for storing to the m×n memory array to generate an encoded m×n memory array; and
decoding the encoded m×n memory array by arranging binary representations of entries in a subarray of a modified m×n memory array into a first binary sequence of length (m−1)(n−1)k, where k is an integer.

* * * * *

UNITED STATES PATENT AND TRADEMARK OFFICE
CERTIFICATE OF CORRECTION

PATENT NO. : 8,880,782 B2  
APPLICATION NO. : 13/277837  
DATED : November 4, 2014  
INVENTOR(S) : Erik Ordentlich et al.

Page 1 of 1

It is certified that error appears in the above-identified patent and that said Letters Patent is hereby corrected as shown below:

In the Claims

In column 12, line 17, in Claim 13, delete "2" and insert -- 2, --, therefor.

Signed and Sealed this  
Twenty-sixth Day of May, 2015

Michelle K. Lee  
*Director of the United States Patent and Trademark Office*